(12) United States Patent
Zhang et al.

(10) Patent No.: US 11,248,448 B2
(45) Date of Patent: Feb. 15, 2022

(54) DESPIKING RESERVOIR PROPERTIES

(71) Applicant: Saudi Arabian Oil Company, Dhahran (SA)

(72) Inventors: Xingquan Zhang, Dhahran (SA); Muhammad Ashraf, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 186 days.

(21) Appl. No.: 16/780,196

(22) Filed: Feb. 3, 2020

(65) Prior Publication Data
US 2021/0238962 A1 Aug. 5, 2021

(51) Int. Cl.
*E21B 41/00* (2006.01)
*G06F 30/20* (2020.01)
*E21B 49/00* (2006.01)

(52) U.S. Cl.
CPC .......... *E21B 41/0092* (2013.01); *E21B 49/00* (2013.01); *G06F 30/20* (2020.01)

(58) Field of Classification Search
CPC ....... E21B 41/0092; E21B 49/00; G06F 30/20
See application file for complete search history.

(56) References Cited

U.S. PATENT DOCUMENTS

| | | |
|---|---|---|
| 5,995,906 A | 11/1999 | Doyen et al. |
| 6,490,526 B2 | 12/2002 | Matteucci et al. |
| 9,355,070 B2 | 5/2016 | Thorne |
| 9,448,313 B2 | 9/2016 | Hofland et al. |
| 9,817,143 B2 | 11/2017 | Groenestijn |
| 10,061,046 B2 | 8/2018 | Hofland et al. |

(Continued)

FOREIGN PATENT DOCUMENTS

WO  WO 2020142257  7/2020

OTHER PUBLICATIONS

Basarir, Hakan, et al. "Geostatistical modeling of spatial variability of SPT data for a borax stockpile site." Engineering Geology 114.3-4 (2010): 154-163. (Year: 2010).*

(Continued)

*Primary Examiner* — Omar F Fernandez Rivas
*Assistant Examiner* — Joshua E. Jensen
(74) *Attorney, Agent, or Firm* — Fish & Richardson P.C.

(57) ABSTRACT

A computer system receives multiple datapoints of a geomechanical property of a hydrocarbon reservoir modeled by a three-dimensional (3D) grid. Each datapoint corresponds to a respective grid cell of the 3D grid. Each grid cell of the 3D grid is represented by 3D coordinates. For each grid cell of the 3D grid, the computer system generates a data component of the geomechanical property based on the 3D coordinates of the grid cell. The computer system adds the data component to a datapoint corresponding to the grid cell to provide an augmented set of datapoints. The computer system transforms the augmented set of datapoints into a Gaussian distribution using Gaussian approximation. The computer system simulates the geomechanical property of the hydrocarbon reservoir based on the Gaussian distribution using sequential Gaussian simulation. A display device of the computer system generates a graphical representation of the geomechanical property of the hydrocarbon reservoir based on the sequential Gaussian simulation.

17 Claims, 11 Drawing Sheets

(56) References Cited

U.S. PATENT DOCUMENTS

2006/0241920 A1* 10/2006 Ravalec-Dupin ...... G01V 11/00
                                                                       703/2
2018/0275301 A1* 9/2018 Ma ........................ G01V 1/288

OTHER PUBLICATIONS

Kerry et al., "Determining the effect of asymmetric data on the variogram. I. Underlying asymmetry," Computers & Geosciences, Oct. 2007, 33(10): 1212-1232, 21 pages.
PCT International Search Report and Written Opinion in International Appln. No. PCT/US20201/016312, dated Jun. 30, 2021, 17 pages.
Pyrcz and Deutsch, Geostatistical Reservoir Modeling, 2nd Edition, Oxford University Press, New York, 2014, Chapter 2, p. 49-53, 5 pages.
U.S. Appl. No. 17/066,085, filed Oct. 8, 2020, Zhang et al.
Pyrcz and Deutsch, Geo statistical Reservoir Modeling, 2nd Edition, Oxford University Press, New York, 2014, p. 49-53.

* cited by examiner

Receive, by a computer system, multiple datapoints of a geomechanical property of a hydrocarbon reservoir modeled by a three-dimensional (3D) grid, each datapoint of the multiple datapoints corresponding to a respective grid cell of the 3D grid, each grid cell of the 3D grid represented by 3D coordinates
1104

For each grid cell of the 3D grid: generate, by the computer system, a data component of the geomechanical property based on the 3D coordinates of the grid cell, and add, by the computer system, the data component to a datapoint corresponding to the grid cell to provide an augmented set of datapoints
1108

Transform, by the computer system, the augmented plurality of datapoints into a Gaussian distribution using Gaussian approximation
1112

Simulate, by the computer system, the geomechanical property of the hydrocarbon reservoir based on the Gaussian distribution using sequential Gaussian simulation
1116

Generate, by a display device of the computer system, a graphical representation of the geomechanical property of the hydrocarbon reservoir based on the sequential Gaussian simulation
1120

DESPIKING RESERVOIR PROPERTIES

TECHNICAL FIELD

This description relates generally to hydrocarbon reservoirs, for example, to despiking hydrocarbon reservoir property data using a coordinate-related trend.

BACKGROUND

Hydrocarbon reservoir modeling and simulation can pose several challenges. The input hydrocarbon reservoir property data can include a number of spikes or vertical jumps in the distribution because of a large number of similar values. Hydrocarbon reservoir modeling using input data distributions having spikes or vertical jumps can lead to inaccurate simulation and prediction of geomechanical properties of a reservoir.

SUMMARY

Methods, apparatus, and systems for despiking hydrocarbon reservoir property data are disclosed. A computer system receives multiple datapoints of a geomechanical property of a hydrocarbon reservoir modeled by a three-dimensional (3D) grid. Each datapoint corresponds to a respective grid cell of the 3D grid. Each grid cell of the 3D grid is represented by 3D coordinates. For each grid cell of the 3D grid, the computer system generates a data component of the geomechanical property based on the 3D coordinates of the grid cell. The computer system adds the data component to a datapoint corresponding to the grid cell to provide an augmented set of datapoints. The computer system transforms the augmented set of datapoints into a Gaussian distribution using Gaussian approximation. The computer system simulates the geomechanical property of the hydrocarbon reservoir based on the Gaussian distribution using sequential Gaussian simulation. A display device of the computer system generates a graphical representation of the geomechanical property of the hydrocarbon reservoir based on the sequential Gaussian simulation.

In some implementations, the data component is a number of orders of magnitude smaller than the datapoint corresponding to the grid cell, and the number is in a range from 5 to 8.

In some implementations, the data component is generated using a sum of the 3D coordinates of the grid cell.

In some implementations, simulating the geomechanical property includes deleting, by the computer system, the data component for each grid cell of the 3D grid from the sequential Gaussian simulation to provide the geomechanical property at multiple locations of the hydrocarbon reservoir.

In some implementations, transforming the augmented set of datapoints includes ranking, by the computer system, each augmented datapoint of the augmented set of datapoints with a rank within the Gaussian distribution. The computer system assigns each augmented datapoint of the augmented set of datapoints to a value of the geomechanical property based on the rank.

In some implementations, the Gaussian approximation is based on Gaussian kernels or multiplicative skewing.

In some implementations, the computer system applies a logarithm transformation to the plurality of datapoints to reduce an amount of skew in the plurality of datapoints.

BRIEF DESCRIPTION OF THE DRAWINGS

FIG. 11 illustrates a process for despiking hydrocarbon reservoir property data.

DETAILED DESCRIPTION

The implementations disclosed provide methods, apparatus, and systems for despiking hydrocarbon reservoir property data using a coordinate-related trend. The implementations enable despiking of the input data without the need for external tools or programming. The implementations can be applied to any available geomodeling package. The coordinate-related trend used can be applied to any continuous reservoir geomechanical property variable that requires a Gaussian score transformation. There is, thus, no need to fit a real data-driven trend model to the input data. The coordinate-related trend model is removed from the geostatistical simulation model automatically, such that the original input data is not impacted. The implementations can be applied to a large number of spiked data values. The implementations reduce the computation time for despiking the input data, such that when a three-dimensional (3D) coordinate-related trend model is used, the NST process takes on the order of seconds. Therefore, using the disclosed implementations, a large geological model having multiple facies and zones can be processed with reduced computation time.

Figure 1A:
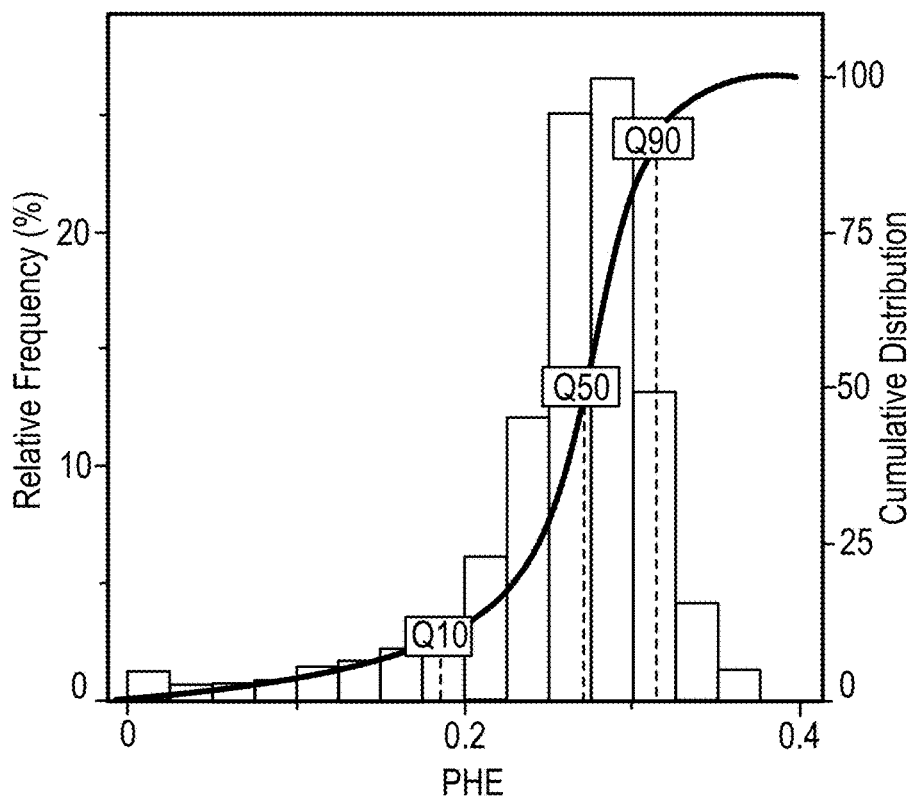
FIG. 1A illustrates an example set of datapoints.

FIG. 1A illustrates an example set of datapoints. An NST is applied to the multiple datapoints of a geomechanical property of a hydrocarbon reservoir shown in FIG. 1A. An oil reservoir or hydrocarbon reservoir refers to a subsurface pool of hydrocarbons contained in porous or fractured rock formations. A hydrocarbon well refers to a boring in the Earth that is designed to bring petroleum oil hydrocarbons and natural gas to the surface. Multiple hydrocarbon wells can be bored in a reservoir.

Figure 1B:
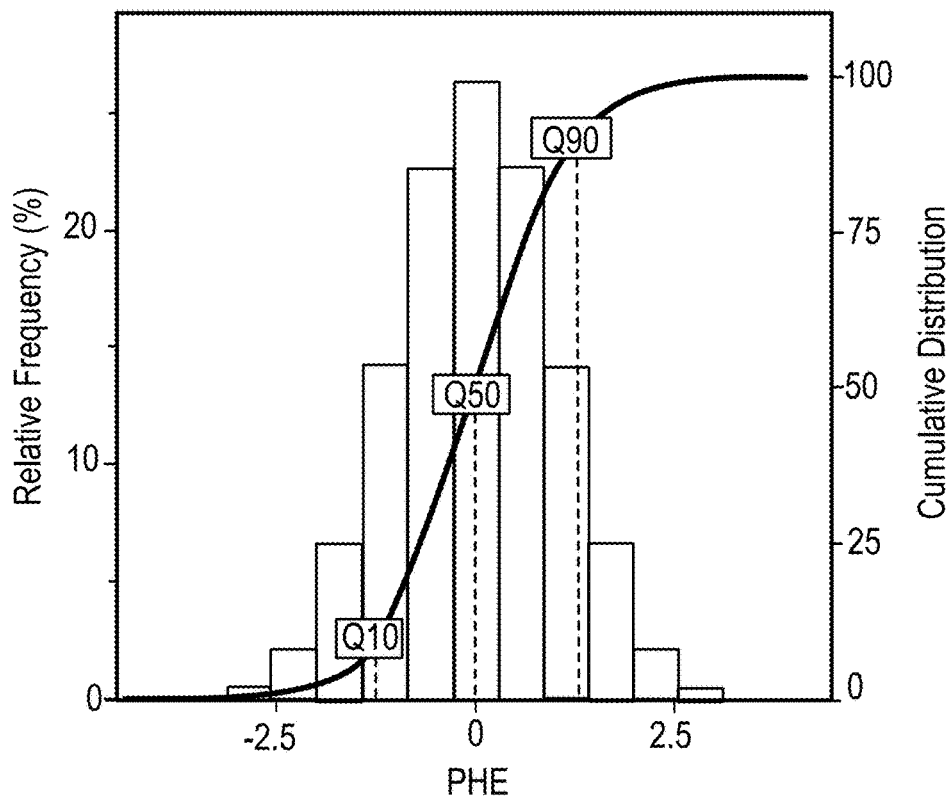
FIG. 1B illustrates an example normal score transformation (NST).

FIG. 1B illustrates a quantile-to-quantile process for normal score transformation (NST). The process illustrated in FIG. 1B can be performed by a computer system. An example of such a computer system is described in more detail with reference to FIG. 11. FIG. 1A shows the original porosity distribution (multiple datapoints of a geomechanical property of a hydrocarbon reservoir). FIG. 1B shows the transformed porosity distribution. Geostatistical algorithms can use a Gaussian distribution of multiple datapoints of a geomechanical property of a hydrocarbon reservoir for probabilistic prediction of continuous reservoir properties. The probabilistic prediction of continuous reservoir properties can be used for constructing, for example, a stochastic porosity model to an amount of the original oil in place (OOIP) during a reservoir exploration stage as well as a reservoir development stage.

If the datapoints of the geomechanical property of the hydrocarbon reservoir are not Gaussian distributed, a computer system transforms the datapoints of the geomechanical property into a Gaussian distribution. For example, a quantile-to-quantile NST is used to convert an arbitrary distribution to a standard normal distribution, as illustrated in FIG. 1B. The NST method matches a quantile of the data distribution (the multiple datapoints of the geomechanical property of the hydrocarbon reservoir) to the same quantile of the standard normal distribution. Each datapoint is transformed to a normal score value that indicates a number of standard deviations that the observation (datapoint) is above or below a mean value.

FIG. 1A illustrates an up-scaled porosity dataset (datapoints of porosity of a hydrocarbon reservoir). The computer system transforms the datapoints into a standard normal distribution by using a cumulative frequency (0.1) corresponding to a current porosity value (0.1875). The computer system uses a normal score (−1.2816) with the same cumulative frequency on the standard normal distribution. The transformed normal score for the porosity value of 0.1875 is −1.2816. The process is repeated for all the porosity values in the set of datapoints shown in FIG. 1A.

If the original datapoints are distinct, the transformed data is normally distributed. If the original datapoints are not distinct, the resultant distribution can have spikes or vertical jumps because of a large amount of the same constant values among the multiple datapoints. The removal of the same constant values among the multiple datapoints is sometimes referred to as "despiking." For example, a random despiking approach can be used when a percentage of spiked values is not large. An external tool can be required if the random despiking option is not available in a geological modeling package.

Figure 2:
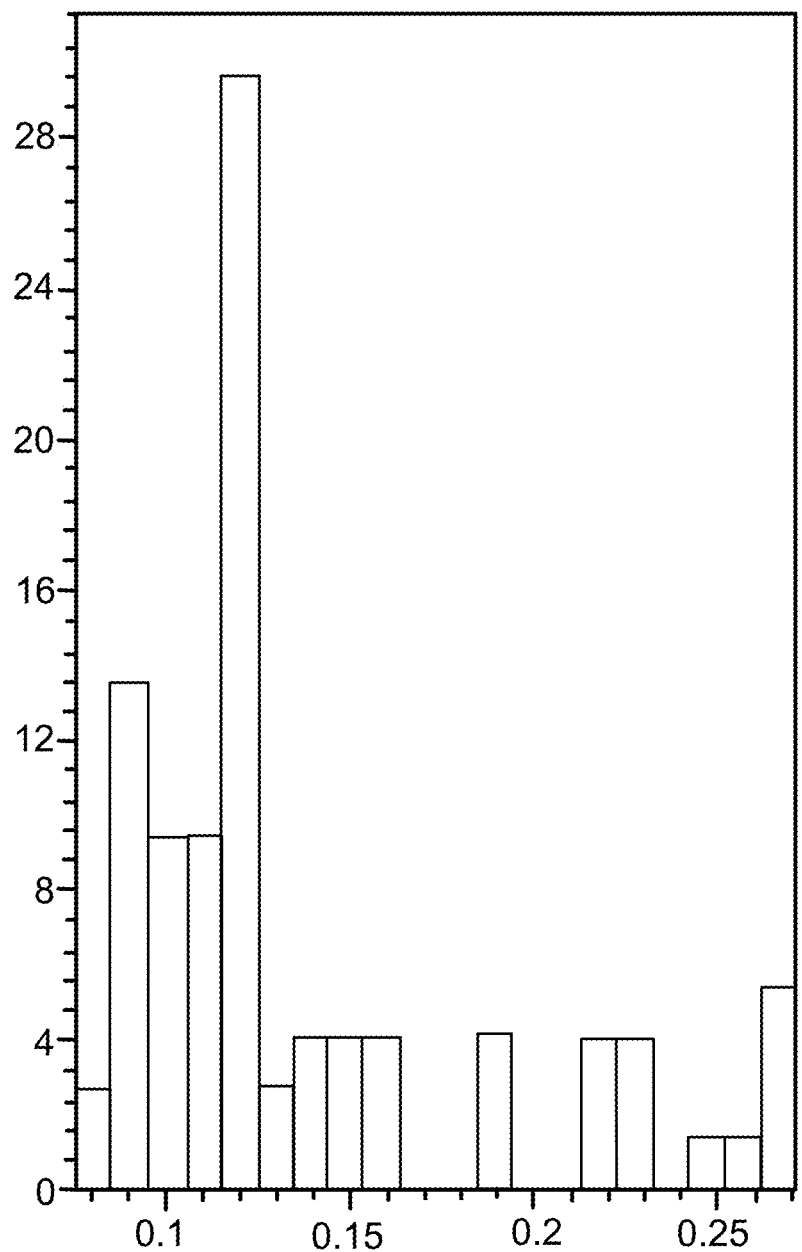
FIG. 2 illustrates multiple porosity datapoints of a hydrocarbon reservoir

FIG. 2 illustrates multiple porosity datapoints of a hydrocarbon reservoir. The datapoints in FIG. 2 contain a significant spike at 0.12. The original input data set Geostatistical algorithms can invoke a Gaussian distribution for probabilistic prediction of continuous reservoir properties. Hence, the input datapoints are required to follow a standard normal distribution. Using a Gaussian distribution, a computer system can generate an inference of the conditional distribution for simulating continuous properties. If the reservoir properties (datapoints) are not normally distributed, the datapoints of the geomechanical property of the hydrocarbon reservoir are transformed into a normal distribution.

Figure 3:
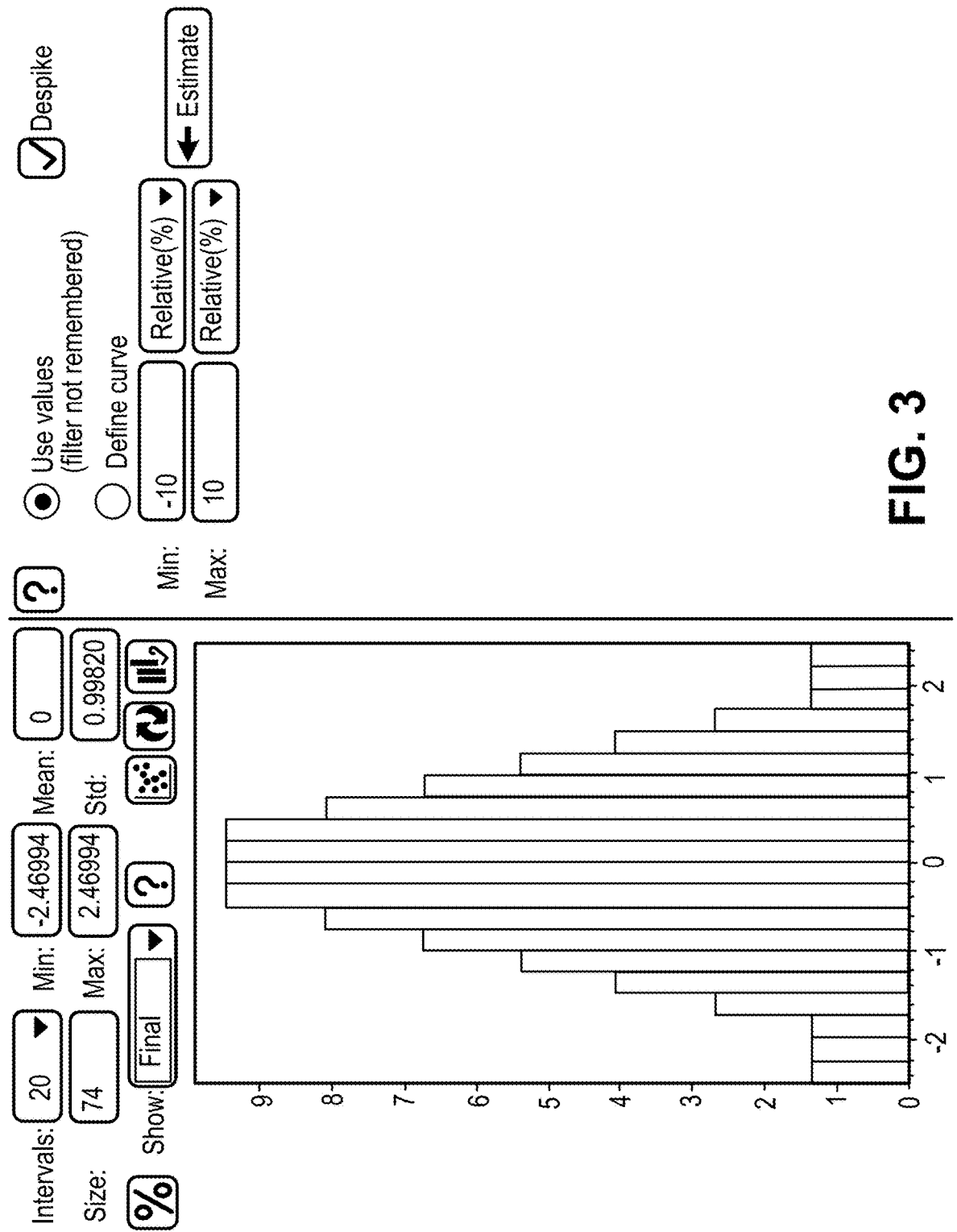
FIG. 3 illustrates a transformation of multiple porosity datapoints into a Gaussian distribution using random despiking.

FIG. 3 illustrates a transformation of multiple porosity datapoints into a Gaussian distribution using random despiking. The datapoints illustrated in FIG. 2 can be despiked without running an external program. For example, a random noise dataset can be generated and used to break potential spikes. An example transformation of multiple porosity datapoints using addition of random noise is illustrated in more detail with reference to FIG. 5. Referring to FIG. 3, using random despiking, the multiple datapoints are transformed into a normal distribution.

The spiked datapoints are ordered prior to performing a Gaussian transformation to make the datapoint values distinct. The ordering procedure is sometimes referred to as "despiking." Spikes can occur in datapoints having values at or below a detection limit. Such datapoints can be represented by 0.0 values, such as for effective porosity, in the set of datapoints. In some implementations, the zero spike values are isolated into a separate population. When the spike values are interspersed with other datapoints of a population and there are multiple spikes (especially when the set of datapoints is large), isolating spiked values is less useful. In such a case, a random despiking approach, illustrated in FIG. 3 is used.

Single precision float data is used for geostatistical simulation algorithms, such as SGS. A single precision float can preserve the datapoint values up to 7 or 8 decimal places. However, to improve the precision of transforming datapoints to a normal distribution and to avoid creating identical constant values, a double precision float data type is used for normal score transformed values. A double precision float can be used for datapoints having 14 to 15 decimal places. Each datapoint is thus converted twice if the NST process is applied. The first conversion is (up-scaling) from the original scale to the normal score. The second conversion is (down-scaling) from the normal score back to the original scale. The spiked datapoint values can therefore be made distinct by adding a noise value to them. The added noise is small enough to avoid impacting the intrinsic features of the original input datapoints, such as a variogram, a mean, and a data trend. The variogram refers to a description of the spatial continuity of the datapoints. The data trend refers to a principal direction of the spatial continuity of the datapoints.

In some implementations, random despiking adds a random value represented by expression (1) to each input datapoint.

$$r_i \times 10^{-6} \quad (1)$$

Here, $r_i \in (0,1)$. The random value is added to each datapoint and not only to spiked values. The added random noise does not affect the usability of the geological model because of the scale of the added random noise.

Figure 4:
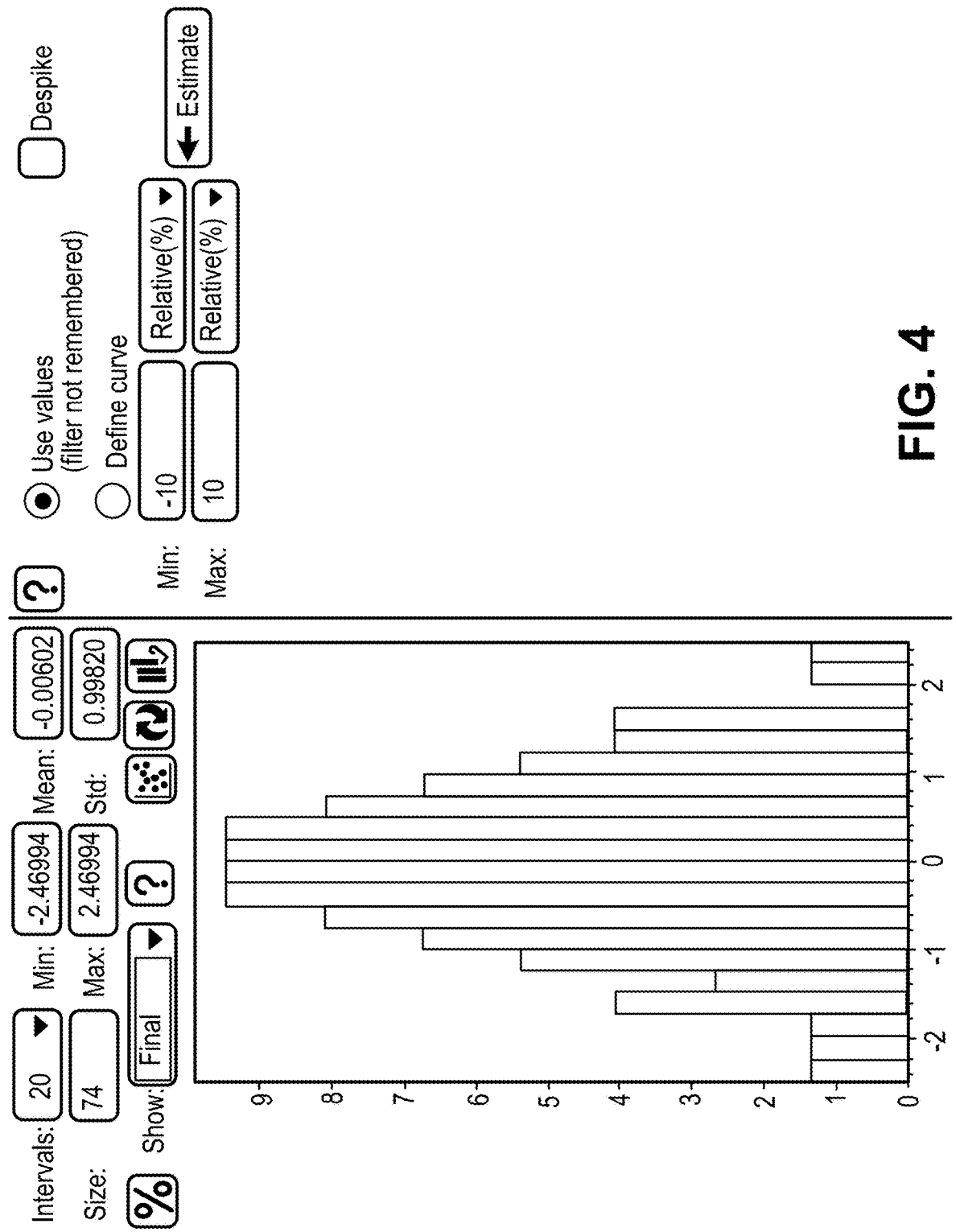
FIG. 4 illustrates a transformation of multiple porosity datapoints without despiking.

FIG. 4 illustrates a transformation of multiple porosity datapoints without despiking. As shown in FIG. 4, without the use of despiking, the datapoints are not transformed into a normal distribution because of a large number of spiked values.

Figure 5:
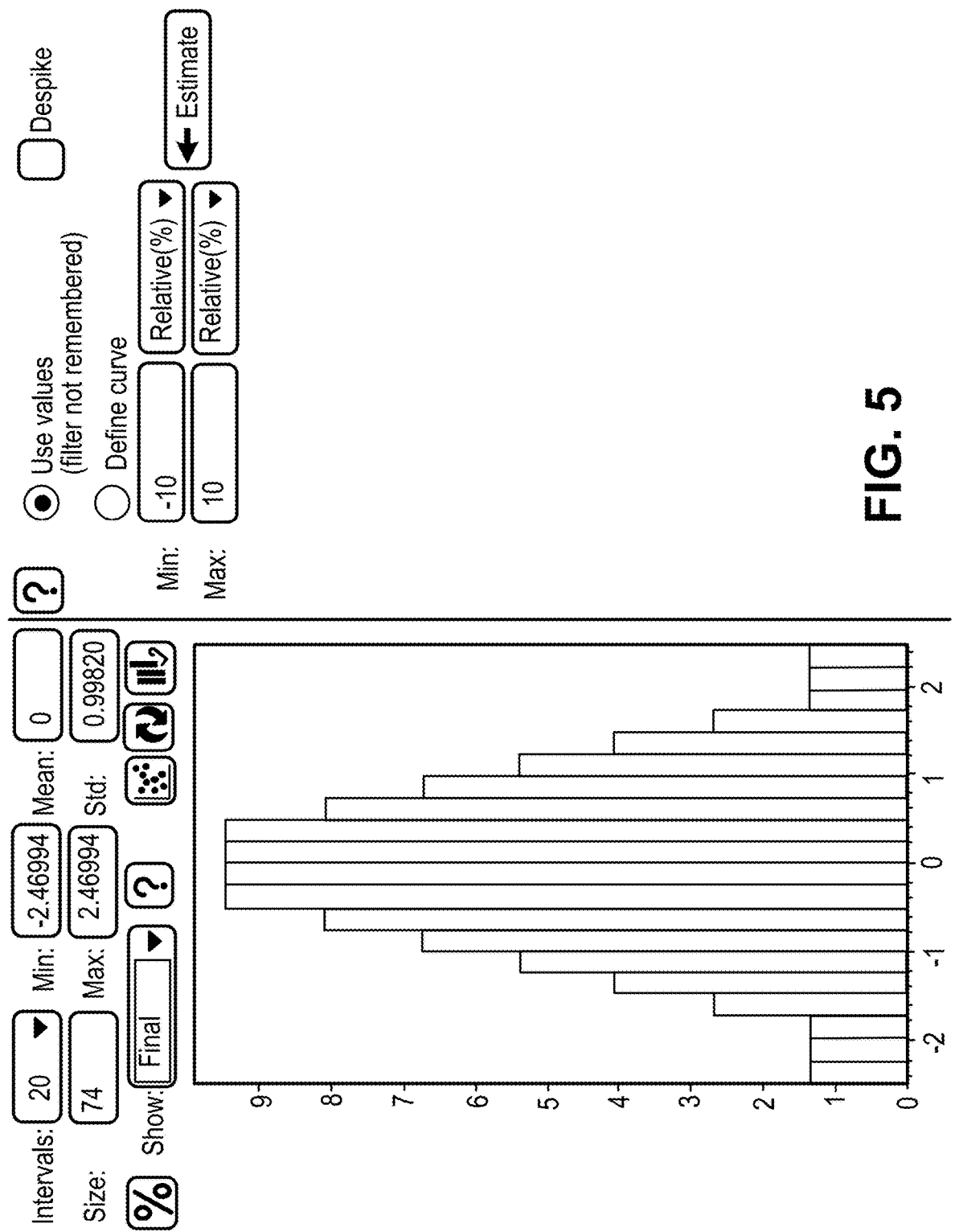
FIG. 5 illustrates a transformation of multiple porosity datapoints using addition of random noise.

FIG. 5 illustrates a transformation of multiple porosity datapoints using addition of random noise. A random noise dataset is generated at a scale of $10^{-6}$. The random noise dataset is added to the original set of datapoints to generate a set of augmented datapoints. The set of augmented datapoints is transformed into a normal distribution without the use of despiking, as shown in FIG. 5. The minimum, maximum, and mean values of the set of augmented datapoints are similar to the minimum, maximum, and mean values of the original set of datapoints. The addition of the random noise does not change the data scale significantly. However, the original set of datapoints does change, and the changes are transferred to the final geological model. When the maximum value is meaningful, such as the maximum value of water saturation (1.0) that is the physical limit of effective water saturation, the set of augmented datapoints contains values greater than 1.0 because the noise values are positive. The input data type is single precision float, which can hold maximum 7 to 8 decimal places. The added random noise is at a scale of $10^{-6}$. Hence, if a number of the identical constant values is greater than 1000, identical constant values will occur again.

Figure 6:
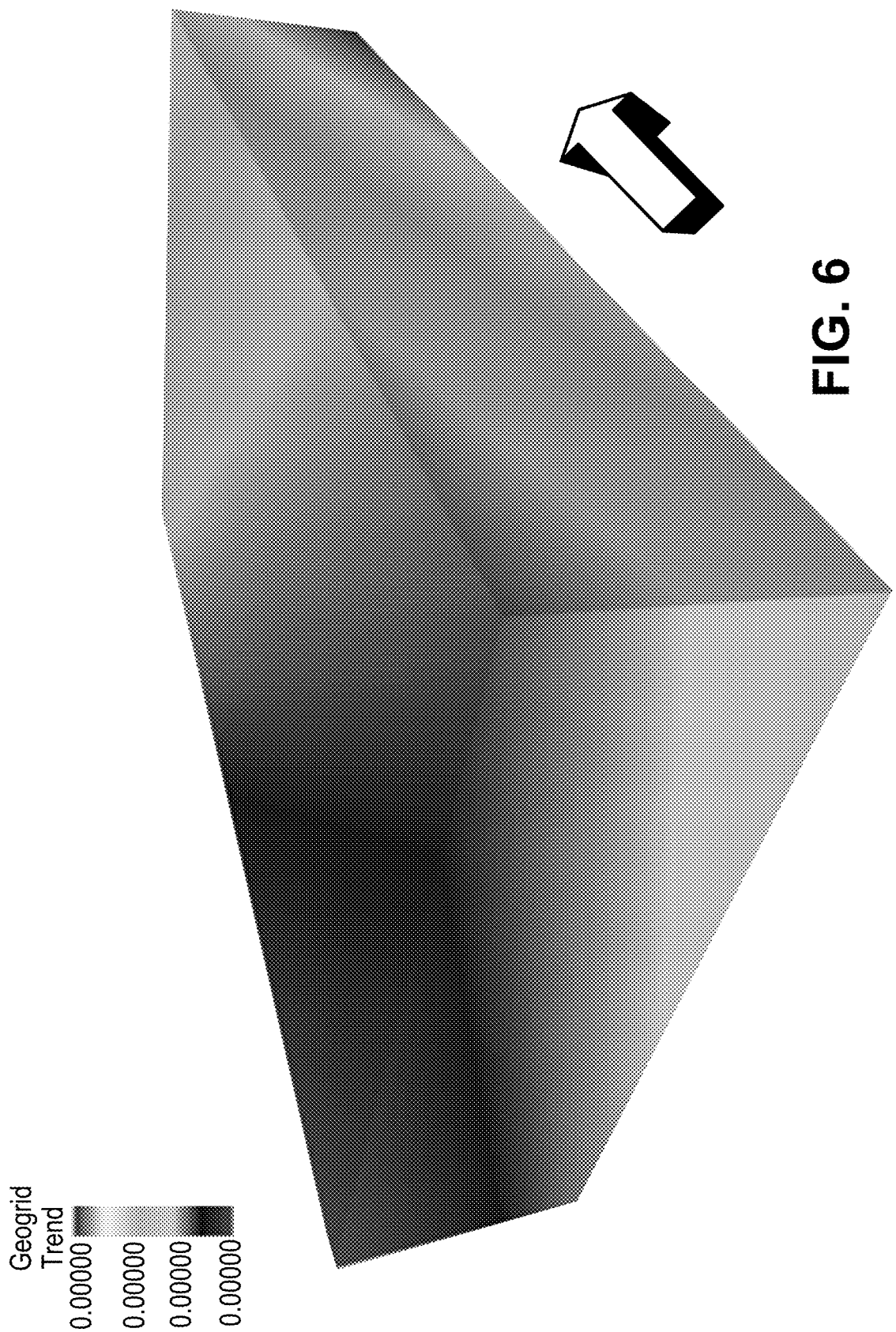
FIG. 6 illustrates a coordinate-related trend model.

FIG. 6 illustrates a coordinate-related trend model. In FIG. 6, an example trend model generated using a reservoir modeling system is shown. The trend model is related to coordinates of the grid cells, and is not related to or affected by real data. The scale of the trend values result in the fact that the minimum and maximum data component values cannot be displayed with five decimal places. The original porosity distribution (porosity datapoints) is illustrated with reference to FIG. 7, showing a significant spike near the zero (0) value.

Figure 7:
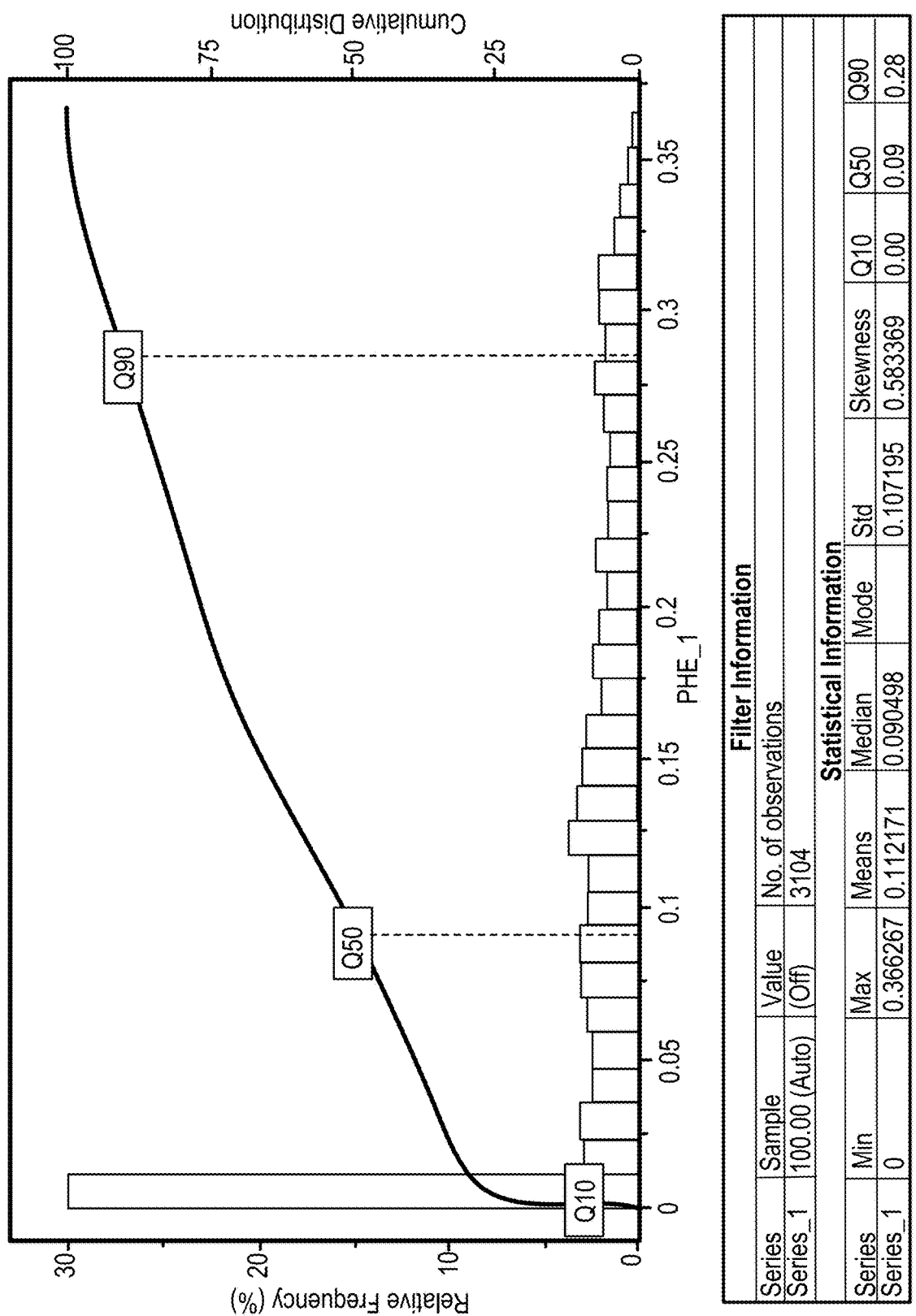
FIG. 7 illustrates multiple porosity datapoints having spikes.

FIG. 7 illustrates multiple porosity datapoints having spikes. In FIG. 7, the set of multiple datapoints is a non-parametric distribution represented as a list of data values. The distribution is constructed by sorting the datapoints in ascending order, as shown in expression (2).

$$z_1 < z_2 < \ldots < z_n \qquad (2)$$

When each datapoint is distinct, the resulting transformed distribution is a normal distribution. However, the input set of datapoints can contain a number of identical values as a result of (a) analytical detection limits, (b) physical limits, such as zeros (0s) as a minimum value of porosity or ones (1s) as a maximum value of water saturation, or (c) the rounding of decimal numbers. For example, two decimal places are often used for porosity and water saturation values. In FIG. 7, there is a significant spike at zero (0). The number of zeros is approximately 1000.

Multiple datapoints having a same numerical value are sometimes referred to as "spikes." The spikes from the input distribution (for example, multiple porosity datapoints) are transferred to the transformed distribution. The spikes are thus eventually transferred to a simulation model of the hydrocarbon reservoir. A sequential Gaussian simulation (SGS) algorithm used for simulating the geomechanical property of the hydrocarbon reservoir based on the transformed distribution generates a smaller percentage of the spiked values. SGS is used for stochastic characterization of the geomechanical properties of the hydrocarbon reservoir. For example, if 20% of the original set of porosity datapoints has zeros (0s), the simulation model will generate fewer zero values, such as 15%. The mean of the porosity model increases, resulting in higher pore volume estimates. Similarly, if spikes occur at the maximum datapoint value, the mean of the simulation model decreases. Removing spiked values are therefore important for reproducing the input histogram correctly. For example, for a hydrocarbon reservoir model having a billion barrels of reserve, a 1% pore volume change can equal tons of hydrocarbons.

Figure 8:
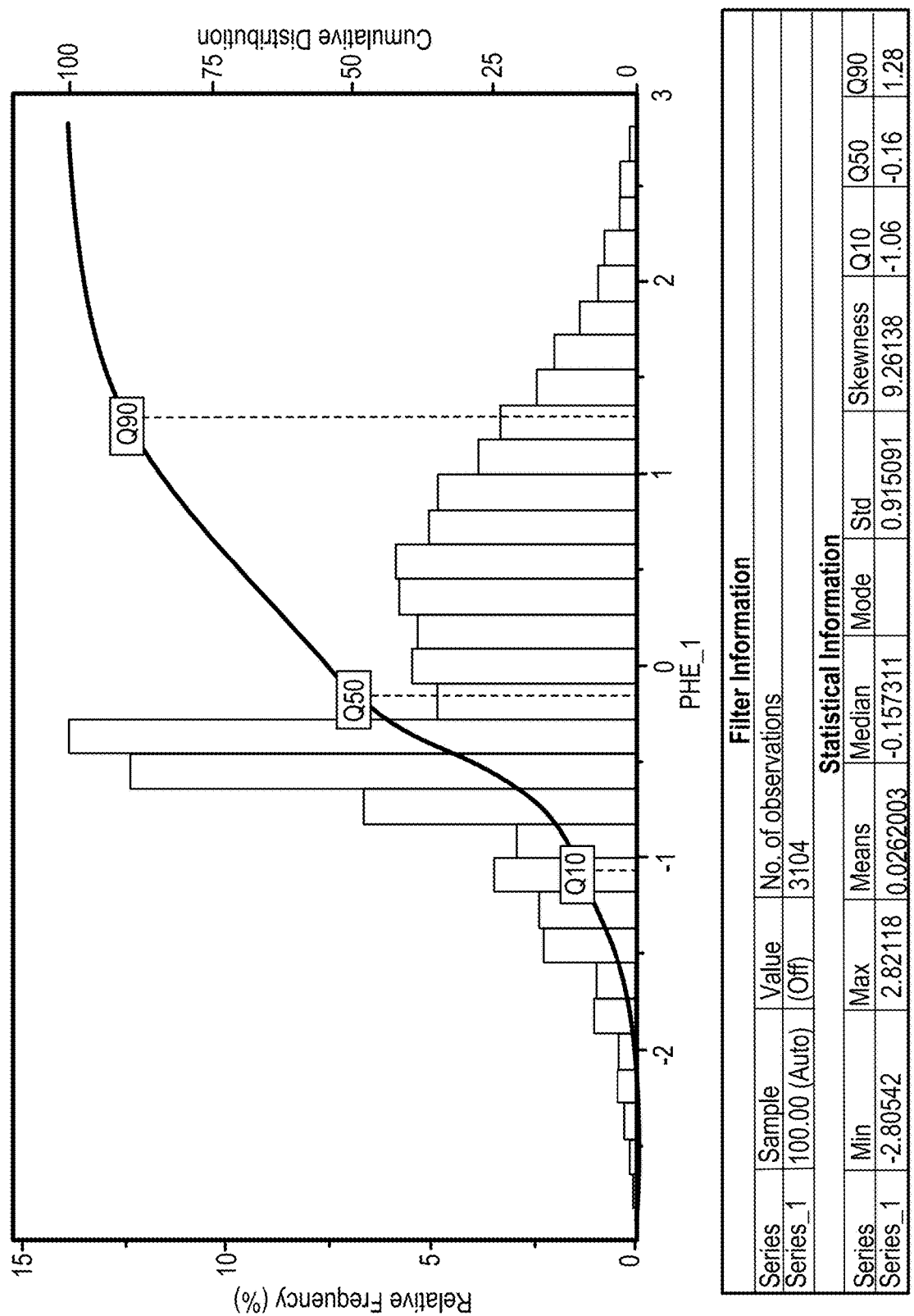
FIG. 8 illustrates a transformation of multiple porosity datapoints having spikes.

FIG. 8 illustrates a transformation of multiple porosity datapoints having spikes. Using a conventional application of NST, the resulting distribution shown in FIG. 8 contains spikes because of a large number of constant values. The spikes are preserved using a conventional NST application.

Figure 9:
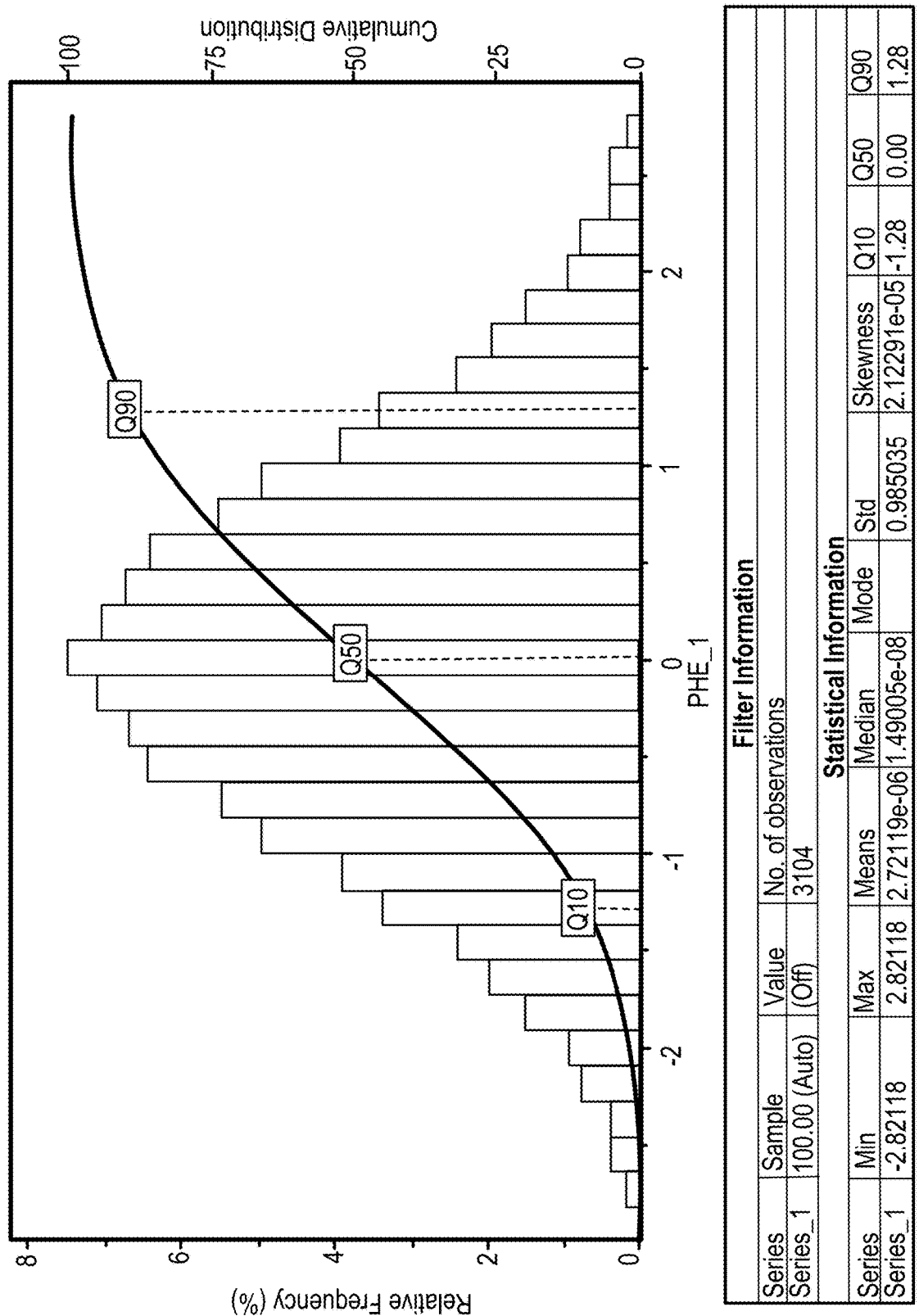
FIG. 9 illustrates a transformation of multiple porosity datapoints without spikes.

FIG. 9 illustrates a transformation of multiple porosity datapoints without spikes. After the application of the 3D coordinate-related trend model, shown in FIG. 6, the resulting distribution is a Gaussian distribution.

Figure 10:
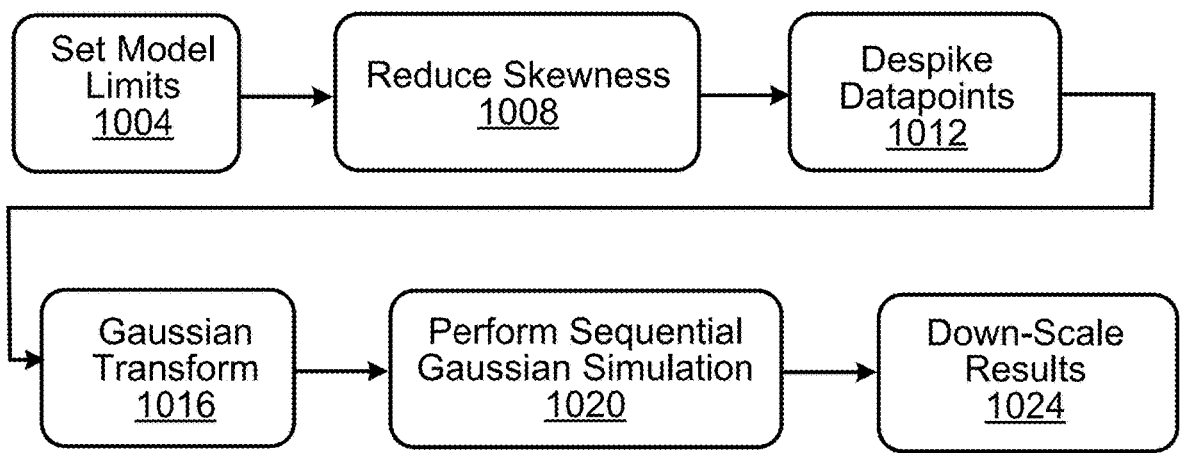
FIG. 10 illustrates a process for despiking hydrocarbon reservoir property data.

FIG. 10 illustrates a process for despiking hydrocarbon reservoir property data. In step 1004, minimum and maximum limits are set for the multiple datapoints of a geomechanical property of a hydrocarbon reservoir, for the coordinate-related trend model, or for the generated Gaussian distribution. The minimum and maximum limits can be calculated from the input datapoints or from the physical limits of the variable representing the geomechanical property, for example, [0, 1] can be used as the limits for water saturation.

In step 1008, a skewness reduction algorithm, such as a logarithm transformation, is applied to reduce a skewness of the input distribution (the multiple datapoints of the geomechanical property of the hydrocarbon reservoir). For example, the computer system applies a logarithm transformation to the multiple datapoints to reduce an amount of skew in the multiple datapoints. The logarithm transformation can be used to transform skewed data to conform to normality. If the original data (the multiple datapoints of the geomechanical property of the hydrocarbon reservoir) follows a log-normal distribution, then the logarithm transformed data follows a normal or near normal distribution In step 1012, the hydrocarbon reservoir property data is despiked using a coordinate-related trend, as illustrated and described in more detail with reference to FIG. 11. The hydrocarbon reservoir is modeled by a 3D grid, as illustrated in FIG. 6. Each datapoint of the multiple datapoints corresponds to a respective grid cell of the 3D grid. The spiked values within the multiple datapoints can be clustered in space. Because non-pay facies, such as shales, are sometimes not analyzed or have inadequate core samples for analysis, a value of 0.0 can be assigned to the effective porosity of shales. Similarly, datapoints are sometimes "cleaned up" by the use of a constraint. For example, an effective water saturation below the oil-water contact level is set to all 1.0s. As the result, spikes are observed to be laterally controlled by lithologies or vertically controlled by oil-water contact. Thus, spiked values in the multiple datapoints of the geomechanical property of the hydrocarbon reservoir are often spatially adjacent.

Each grid cell of the 3D grid is represented by 3D coordinates, for example, a row number J, a column number I, and a layer number K. A data component based on the 3D coordinates is used to despike the multiple datapoints of the geomechanical property of the hydrocarbon reservoir without changing the input data values. The geostatistical features of the input dataset are also be preserved, especially a variogram model and the intrinsic data trend. The implementations disclosed can be applied to large datasets having thousands of identical constant values. For example, a trend model can be built using expression (3) as follows.

$$(0.1 \times I + 0.2 \times J + 0.3 \times K) \times 10^{-7} \qquad (3)$$

Here, I represents a column index, J represents a row index, and K represents a layer index of each grid cell. Using the trend model described by expression (3) will remove the identical constant values in the multiple datapoints.

For each grid cell of the 3D grid, the computer system generates a data component of the geomechanical property based on the 3D coordinates of the grid cell. The data component is used to despike the datapoints. As a result, despiking using a coordinate-related trend is performed without the need of an external tool. The resulting augmented set of datapoints is stable even when a number of the spiked values is large, such as 10000 identical, constant values. The coordinate related trend component (data component of the geomechanical property based on the 3D coordinates of the grid cell) is added to each input datapoint to make the augmented datapoints distinct.

The trend component (data component) is added to the data component of the geomechanical property to break the spatially adjacent identical values and make the augmented datapoint values distinct. The trend values are small enough to avoid changing the intrinsic features of the original datapoints. The trend values are spatial coordinate related, such that the lateral and vertical spikes are both despiked. For example, a trend model can be built using expression (4) as follows.

$$f(I, J, K) \times 10^{-4} \qquad (4)$$

Here, f represents a function of the 3D coordinates, and I represents a column index, J represents a row index, and K represents a layer index of each grid cell. The component A is selected, such that a maximum value of the trend model is small enough to avoid impacting the intrinsic data features, such as variogram and trends. The scale of the maximum trend value is at the scale of 10-5 to 10-7, depending on a number of the identical constant values in the multiple datapoints of the geomechanical property of the hydrocarbon reservoir. The trend values can be applied to any continuous reservoir variables that need to be despiked.

In some implementations, the data component is a number of orders of magnitude smaller than the datapoint corresponding to the grid cell, and the number is in a range from 5 to 8. The trend values (data component of the geomechanical property) are small enough, such that the intrinsic features of the original input datapoints are not impacted. Thus a variogram constructed from the augmented set of datapoints will be unchanged.

In some implementations, the data component is generated using a sum of the 3D coordinates of the grid cell. For example, the trend component or data component can be generated as shown in expression (5).

$$(I+J+K) \times 10^{-A} \quad (5)$$

Here, I represents a column index, J represents a row index, and K represents a layer index of each grid cell. The exponent A is selected, such that a maximum trend value (data component) is at a scale of $10^{-6}$ or $10^{-7}$. The computer system adds the data component to a datapoint corresponding to the grid cell to provide an augmented set of datapoints. Because the trend values are small, they break ties in the values of the original input datapoints but do not alter the intrinsic features of the datapoints.

In step 1016, the computer system transforms the augmented set of datapoints into a Gaussian distribution using Gaussian approximation. Step 1016 is illustrated in more detail with reference to FIG. 1B. In some implementations an NST is used to transform the augmented set of datapoints into a Gaussian distribution, such that the augmented set of datapoints resembles a standard normal distribution. In some implementations, transforming the augmented set of datapoints includes ranking each augmented datapoint of the augmented set of datapoints with a rank within the Gaussian distribution. For example, in a quantile-to-quantile NST procedure, the computer system sorts and ranks the augmented set of datapoints.

The computer system assigns each augmented datapoint of the augmented set of datapoints to a value of the geomechanical property based on the rank. For example, an equivalent rank from a standard normal distribution is found for each rank from the augmented set of datapoints. The normal distribution values associated with the equivalent ranks from the standard normal distribution are used to generate the transformed dataset (the Gaussian distribution). A quantile-to-quantile NST matches a p-quantile of the data distribution (augmented set of datapoints) to a p-quantile of the standard normal distribution (Gaussian distribution). The input distribution is thus transformed to the standard normal distribution. Each datapoint $z_i$ is transformed to a unique normal score value $y_i$ that indicates a number of standard deviations that the datapoint is above or below a mean value.

In some implementations, the Gaussian approximation is based on Gaussian kernels or multiplicative skewing. For example, geostatistical analysis can be performed using direct Gaussian approximation, linear Gaussian approximation, Gaussian kernels, or multiplicative skewing. Direct Gaussian approximation and linear Gaussian approximation use an observed cumulative distribution of the augmented set of datapoints into a Gaussian distribution. A Gaussian kernel transforms a dot product in the augmented set of datapoints into a Gaussian function of a distance between datapoints in the augmented set of datapoints. Multiplicative skewing approximates a cumulative distribution by fitting the augmented set of datapoints that is then skewed by a transformation.

In step 1020, the computer system simulates the geomechanical property of the hydrocarbon reservoir based on the Gaussian distribution using sequential Gaussian simulation (SGS). In some implementations, simulating the geomechanical property includes deleting the data component for each grid cell of the 3D grid from the SGS to provide the geomechanical property at locations of the hydrocarbon reservoir. The added trend data component can be subtracted from the simulation model to improve accuracy at hydrocarbon well locations. The data values at hydrocarbon well locations are therefore not changed on the final simulation model. The disclosed implementations thus do not alter the values of the simulated or predicted geomechanical property of the hydrocarbon reservoir at hydrocarbon well locations. The computer system subtracts the trend data component from the simulation model. Hence, no additional tool is required. The trend model, illustrated in FIG. 6 can be applied to any continuous geomechanical property variable that is to be normal-score transformed. The disclosed implementations can be readily used in a geological modeling package.

In step 1024, the computer system down-scales the simulation results of the geomechanical property to the original scale. Down-scaling is the process to back-transform the simulated Gaussian values to their original data scale. The down-scaling changes the values from double-precision decimals to single-precision decimals.

FIG. 11 illustrates a process for despiking hydrocarbon reservoir property data. Parts of the process are described in greater detail with reference to FIG. 10. In some implementations the process of FIG. 11 is performed by a computer system.

The computer system receives (1104) multiple datapoints of a geomechanical property of a hydrocarbon reservoir modeled by a 3D grid. For example, the geomechanical property can be porosity or saturation. Each datapoint of the multiple datapoints corresponds to a respective grid cell of the 3D grid. Each grid cell of the 3D grid is represented by 3D coordinates, for example, a row number J, a column number I, and a layer number K.

For each grid cell of the 3D grid, the computer system generates (1108) a data component of the geomechanical property based on the 3D coordinates of the grid cell. The computer system adds the data component to a datapoint corresponding to the grid cell to provide an augmented set of datapoints. The trend component (data component) is added to the data component of the geomechanical property to break the spatially adjacent identical values and make the augmented datapoint values distinct. The trend values are small enough to avoid changing the intrinsic features of the original datapoints. The trend values are spatial coordinate related, such that the lateral and vertical spikes are both despiked.

The computer system transforms (1112) the augmented set of datapoints into a Gaussian distribution using Gaussian approximation. In some implementations an NST is used to transform the augmented set of datapoints into a Gaussian distribution, such that the augmented set of datapoints resembles a standard normal distribution. In some implementations, transforming the augmented set of datapoints includes ranking each augmented datapoint of the augmented set of datapoints with a rank within the Gaussian distribution. For example, in a quantile-to-quantile NST procedure, the computer system sorts and ranks the augmented set of datapoints.

The computer system simulates (1116) the geomechanical property of the hydrocarbon reservoir based on the Gaussian distribution using SGS. In some implementations, simulating the geomechanical property includes deleting the data component for each grid cell of the 3D grid from the SGS to provide the geomechanical property at locations of the hydrocarbon reservoir. The added trend data component can be subtracted from the simulation model to improve accuracy at hydrocarbon well locations. The data values at hydrocarbon well locations are therefore not changed on the final simulation model.

The computer system generates (1120), a graphical representation of the geomechanical property of the hydrocarbon reservoir based on the SGS using a display device of the computer system. The graphical representation can include a histogram, a pie chart, or a bar graph. An example graphical representation is illustrated with reference to FIG. 9. In some implementations, the computer system is coupled via a bus to a display device, such as a cathode ray tube (CRT), a liquid crystal display (LCD), plasma display, light emitting diode (LED) display, or an organic light emitting diode (OLED) display for displaying information to a computer user.

The methods described can be performed in any sequence and in any combination, and the components of respective embodiments can be combined in any manner. The machine-implemented operations described above can be implemented by a computer system that includes programmable circuitry configured by software or firmware, or a special-purpose circuit, or a combination of such forms. Such a special-purpose circuit can be in the form of, for example, one or more application-specific integrated circuits (ASICs), programmable logic devices (PLDs), field-programmable gate arrays (FPGAs), or system-on-a-chip systems (SOCs).

Software or firmware to implement the techniques introduced here can be stored on a non-transitory machine-readable storage medium and executed by one or more general-purpose or special-purpose programmable microprocessors. A machine-readable medium, as the term is used, includes any mechanism that can store information in a form accessible by a machine (a machine can be, for example, a computer, network device, cellular phone, personal digital assistant (PDA), manufacturing tool, or any device with one or more processors). For example, a machine-accessible medium includes recordable or non-recordable media (RAM or ROM, magnetic disk storage media, optical storage media, or flash memory devices).

The term "logic," as used herein, means: i) special-purpose hardwired circuitry, such as one or more application-specific integrated circuits (ASICs), programmable logic devices (PLDs), field programmable gate arrays (FPGAs), or other similar device(s); ii) programmable circuitry programmed with software and/or firmware, such as one or more programmed general-purpose microprocessors, digital signal processors (DSPs) or microcontrollers, system-on-a-chip systems (SOCs), or other similar device(s); or iii) a combination of the forms mentioned in i) and ii).

What is claimed is:

1. A method comprising:
   receiving, by a computer system, a plurality of datapoints of a geomechanical property of a hydrocarbon reservoir modeled by a three-dimensional (3D) grid, each datapoint of the plurality of datapoints corresponding to a respective grid cell of the 3D grid, each grid cell of the 3D grid represented by 3D coordinates;
   for each grid cell of the 3D grid:
     generating, by the computer system, a data component of the geomechanical property based on the 3D coordinates of the grid cell, wherein the data component is generated using a sum of the 3D coordinates of the grid cell; and
     adding, by the computer system, the data component to a datapoint corresponding to the grid cell to provide an augmented plurality of datapoints;
   transforming, by the computer system, the augmented plurality of datapoints into a Gaussian distribution using Gaussian approximation;
   simulating, by the computer system, the geomechanical property of the hydrocarbon reservoir based on the Gaussian distribution using sequential Gaussian simulation; and
   generating, by a display device of the computer system, a graphical representation of the geomechanical property of the hydrocarbon reservoir based on the sequential Gaussian simulation.

2. The method of claim 1, wherein the data component is a number of orders of magnitude smaller than the datapoint corresponding to the grid cell, and the number is in a range from 5 to 8.

3. The method of claim 1, wherein simulating the geomechanical property comprises deleting, by the computer system, the data component for each grid cell of the 3D grid from the sequential Gaussian simulation to provide the geomechanical property at a plurality of locations of the hydrocarbon reservoir.

4. The method of claim 1, wherein transforming the augmented plurality of datapoints comprises:
   ranking, by the computer system, each augmented datapoint of the augmented plurality of datapoints with a rank within the Gaussian distribution; and
   assigning, by the computer system, each augmented datapoint of the augmented plurality of datapoints to a value of the geomechanical property based on the rank.

5. The method of claim 1, wherein the Gaussian approximation is based on Gaussian kernels or multiplicative skewing.

6. The method of claim 1, further comprising applying, by the computer system, a logarithm transformation to the plurality of datapoints to reduce an amount of skew in the plurality of datapoints.

7. A non-transitory computer-readable storage medium storing instructions executable by one or more computer processors, the instructions when executed by the one or more computer processors cause the one or more computer processors to:
   receive a plurality of datapoints of a geomechanical property of a hydrocarbon reservoir modeled by a 3D grid, each datapoint of the plurality of datapoints corresponding to a respective grid cell of the 3D grid, each grid cell of the 3D grid represented by 3D coordinates;
   for each grid cell of the 3D grid:
     generate a data component of the geomechanical property based on the 3D coordinates of the grid cell, wherein the data component is generated using a sum of the 3D coordinates of the grid cell; and
     add the data component to a datapoint corresponding to the grid cell to provide an augmented plurality of datapoints;
   transform the augmented plurality of datapoints into a Gaussian distribution using Gaussian approximation;

simulate the geomechanical property of the hydrocarbon reservoir based on the Gaussian distribution using sequential Gaussian simulation; and generate, by a display device, a graphical representation of the geomechanical property of the hydrocarbon reservoir based on the sequential Gaussian simulation.

8. The non-transitory computer-readable storage medium of claim 7, wherein the data component is a number of orders of magnitude smaller than the datapoint corresponding to the grid cell, and the number is in a range from 5 to 8.

9. The non-transitory computer-readable storage medium of claim 7, wherein simulating the geomechanical property causes the one or more computer processors to delete the data component for each grid cell of the 3D grid from the sequential Gaussian simulation to provide the geomechanical property at a plurality of locations of the hydrocarbon reservoir.

10. The non-transitory computer-readable storage medium of claim 7, wherein transforming the augmented plurality of datapoints causes the one or more computer processors to:

rank each augmented datapoint of the augmented plurality of datapoints with a rank within the Gaussian distribution; and assign each augmented datapoint of the augmented plurality of datapoints to a value of the geomechanical property based on the rank.

11. The non-transitory computer-readable storage medium of claim 7, wherein the Gaussian approximation is based on Gaussian kernels or multiplicative skewing.

12. The non-transitory computer-readable storage medium of claim 7, wherein the instructions further cause the one or more computer processors to apply a logarithmic transform to the plurality of datapoints to reduce an amount of skew in the plurality of datapoints.

13. A computer system comprising:

one or more computer processors; and a non-transitory computer-readable storage medium storing instructions executable by the one or more computer processors, the instructions when executed by the one or more computer processors cause the one or more computer processors to:

receive a plurality of datapoints of a geomechanical property of a hydrocarbon reservoir modeled by a 3D grid, each datapoint of the plurality of datapoints corresponding to a respective grid cell of the 3D grid, each grid cell of the 3D grid represented by 3D coordinates;

for each grid cell of the 3D grid:

generate a data component of the geomechanical property based on the 3D coordinates of the grid cell, wherein the data component is generated using a sum of the 3D coordinates of the grid cell; and add the data component to a datapoint corresponding to the grid cell to provide an augmented plurality of datapoints;

transform the augmented plurality of datapoints into a Gaussian distribution using Gaussian approximation;

simulate the geomechanical property of the hydrocarbon reservoir based on the Gaussian distribution using sequential Gaussian simulation; and generate, by a display device, a graphical representation of the geomechanical property of the hydrocarbon reservoir based on the sequential Gaussian simulation.

14. The system of claim 13, wherein the data component is a number of orders of magnitude smaller than the datapoint corresponding to the grid cell, and the number is in a range from 5 to 8.

15. The system of claim 13, wherein simulating the geomechanical property causes the one or more computer processors to delete the data component for each grid cell of the 3D grid from the sequential Gaussian simulation to provide the geomechanical property at a plurality of locations of the hydrocarbon reservoir.

16. The system of claim 13, wherein transforming the augmented plurality of datapoints causes the one or more computer processors to:

rank each augmented datapoint of the augmented plurality of datapoints with a rank within the Gaussian distribution; and assign each augmented datapoint of the augmented plurality of datapoints to a value of the geomechanical property based on the rank.

17. The system of claim 13, wherein the Gaussian approximation is based on Gaussian kernels or multiplicative skewing.

* * * * *